(12) United States Patent
Chen et al.

(10) Patent No.: US 7,859,439 B2
(45) Date of Patent: Dec. 28, 2010

(54) PROCESSING APPARATUS FOR CALIBRATING ANALOG FILTER ACCORDING TO FREQUENCY-RELATED CHARACTERISTIC OF ANALOG FILTER, PROCESSING APPARATUS FOR GENERATING COMPENSATION PARAMETER USED TO CALIBRATE ANALOG FILTER, RELATED COMMUNICATION DEVICE, AND METHODS THEREOF

(75) Inventors: Pei-Wei Chen, Hsinchu (TW); Sheng-Jui Huang, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 81 days.

(21) Appl. No.: 12/420,026

(22) Filed: Apr. 7, 2009

(65) Prior Publication Data

US 2010/0253558 A1 Oct. 7, 2010

(51) Int. Cl.
*H03M 1/10* (2006.01)
(52) U.S. Cl. .................. 341/120; 341/144; 341/155
(58) Field of Classification Search .............. 375/261, 375/346, 350; 341/120, 144
See application file for complete search history.

(56) References Cited

U.S. PATENT DOCUMENTS

2001/0054974 A1* 12/2001 Wright ................. 341/144
2002/0191720 A1* 12/2002 Neubauer ............. 375/350
2007/0291881 A1* 12/2007 Glass .................. 375/346

* cited by examiner

*Primary Examiner*—Jean B Jeanglaude
(74) *Attorney, Agent, or Firm*—Winston Hsu; Scott Margo

(57) ABSTRACT

A processing apparatus for calibrating an analog filter of a communication device in a digital domain is disclosed, wherein the analog filter is arranged to perform a filtering operation upon a communication signal in an analog domain. The processing apparatus includes a signal processing circuit and a digital filter. The signal processing circuit is used for transforming the communication signal between the digital domain and the analog domain. The digital filter is coupled to the signal processing circuit, and used for performing a filtering operation upon the communication signal in the digital domain, wherein a frequency response of the digital filter is arranged to compensate a frequency response of the analog filter according to at least a compensation parameter generated with reference to a frequency-related characteristic of the analog filter.

30 Claims, 10 Drawing Sheets

PROCESSING APPARATUS FOR CALIBRATING ANALOG FILTER ACCORDING TO FREQUENCY-RELATED CHARACTERISTIC OF ANALOG FILTER, PROCESSING APPARATUS FOR GENERATING COMPENSATION PARAMETER USED TO CALIBRATE ANALOG FILTER, RELATED COMMUNICATION DEVICE, AND METHODS THEREOF

BACKGROUND

The present invention relates to calibrating an analog filter of a communication device, and more particular, to processing apparatus and methods that utilize a digital filter to compensate a frequency response of the analog filter.

FIG. 1 is a block diagram of a conventional wireless receiver 100. The wireless receiver 100 comprises an antenna 110, a low noise amplifier (LNA) 120, a mixer (MIX) 130, a filter 140, a programmable gain amplifier (PGA) 150, an analog-to-digital converter (ADC) 160, and a local oscillator (LO) 170. In a wireless communication system, a radio frequency (RF) signal $S_{RF}$ received by the antenna 110 usually comprises a desired signal component $S_{RD}$ and an undesired signal component $S_{RU}$. The spectrum of the RF signal $S_{RF}$ is illustrated in FIG. 2A. The desired signal component $S_{RD}$ contains information desired by the wireless receiver 100, and the undesired signal component $S_{RU}$ comprises signals transmitted at adjacent channels and some un-modulated blocker signals that both interfere with the desired signal component $S_{RD}$. Unfortunately, the signal strength of the undesired signal component $S_{RU}$ is usually much greater than the signal strength of the desired signal component $S_{RD}$. It is therefore important to reject the undesired signal component $S_{RU}$ to avoid saturating the ADC 160.

As illustrated in FIG. 1, the RF signal $S_{RF}$ is amplified by the LNA 120 and then down-converted to an intermediate frequency (IF) band by MIX 130 and LO 170. The IF signal $S_{IF}$ is then filtered by the filter 140 that passes frequencies within a certain frequency range at IF band by a high-Q factor. The spectrum of the filtered IF signal $S_{IF}'$ generated from the filter 140 is schematically illustrated in FIG. 2B. Please note that the signal strength of the undesired signal component $S_{IU}$ of the filtered IF signal $S_{IF}'$ is suppressed. Therefore, the probability of the ADC 160 saturation caused by the undesired signal component $S_{IU}$ can be greatly reduced, and the information contained in the desired signal component $S_{ID}$ can be fully obtained without damage or loss.

In a conventional design, the above-mentioned high-Q filter is implemented using a high-order analog filter, e.g., a 3-order Butterworth filter. The high-Q and high-order analog filters, however, have some drawbacks while utilized in the communication devices. For example, using the high-Q and high-order analog filters will result in a longer settling time of step response in the wireless receiver system, that is, delaying the wireless receiver system. In addition, when resistance or capacitance of the high-Q and high-order analog filter deviates from the original designated value due to unpreventable fabrication process variation, the 3 dB frequency of the high-Q and high-order analog filter will also have a deviation from the original designated value (e.g. deviation from 100 KHz to 120 KHz). Hence, backup capacitances are necessary for calibrating the analog filter in the analog domain, and an extra larger area is required.

SUMMARY

To solve the above-mentioned problems, the exemplary embodiments of the present invention disclose processing apparatus and methods for calibrating an analog filter in the digital domain using a digital filter.

According to an embodiment of the claimed invention, a processing apparatus for calibrating an analog filter of a communication device in a digital domain is disclosed; the analog filter is arranged to perform a filtering operation upon a communication signal in an analog domain. The processing apparatus comprises a signal processing circuit and a digital filter. The signal processing circuit is utilized for transforming the communication signal between the digital domain and the analog domain, and the digital filter, which is coupled to the signal processing circuit, is utilized for performing a filtering operation upon the communication signal in the digital domain. In addition, a frequency response of the digital filter is arranged to compensate a frequency response of the analog filter according to at least a compensation parameter generated with reference to a frequency-related characteristic of the analog filter.

According to another embodiment of the invention, a communication device is disclosed. The communication device comprises an analog filter, a signal processing circuit, and a digital filter. The analog filter is utilized for performing a filtering operation upon a communication signal in an analog domain. The signal processing circuit is coupled to the analog filter and utilized for transforming the communication signal between a digital domain and the analog domain. The digital filter is coupled to the signal processing circuit and utilized for performing a filtering operation upon the communication signal in the digital domain. In addition, a frequency response of the digital filter is arranged to compensate a frequency response of the analog filter according to at least a compensation parameter generated with reference to a frequency-related characteristic of the analog filter.

According to another embodiment of the invention, a processing apparatus for generating a compensation parameter to determine a frequency response of a digital filter to calibrate a frequency response of an analog filter is disclosed. The analog filter and digital filter are respectively used for performing filtering operations upon a communication signal in an analog domain and in a digital domain. The processing apparatus comprises a determining circuit and a compensation parameter generating unit. The determining circuit is utilized for determining a frequency-related characteristic of the analog filter, and the compensation parameter generating unit, which is coupled to the determining circuit, is utilized for generating the compensation parameter according to the frequency-related characteristic.

According to an embodiment of the invention, a method for calibrating an analog filter of a communication device in a digital domain is disclosed; the analog filter is arranged to perform a filtering operation upon a communication signal in an analog domain. The method comprises the following steps: transforming the communication signal between the digital domain and the analog domain; and using a digital filter to perform a filtering operation upon the communication signal in the digital domain, so as to use a frequency response of the digital filter to compensate a frequency response of the analog filter according to at least a compensation parameter generated with reference to a frequency-related characteristic of the analog filter.

According to another embodiment of the invention, a method for generating a compensation parameter to determine a frequency response of a digital filter for calibrating a frequency response of an analog filter is disclosed; the analog filter and the digital filter are respectively used for performing filtering operations upon a communication signal in an analog domain and in a digital domain. The method comprises the steps: determining a frequency-related characteristic of the analog filter, and generating the compensation parameter according to the frequency-related characteristic.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
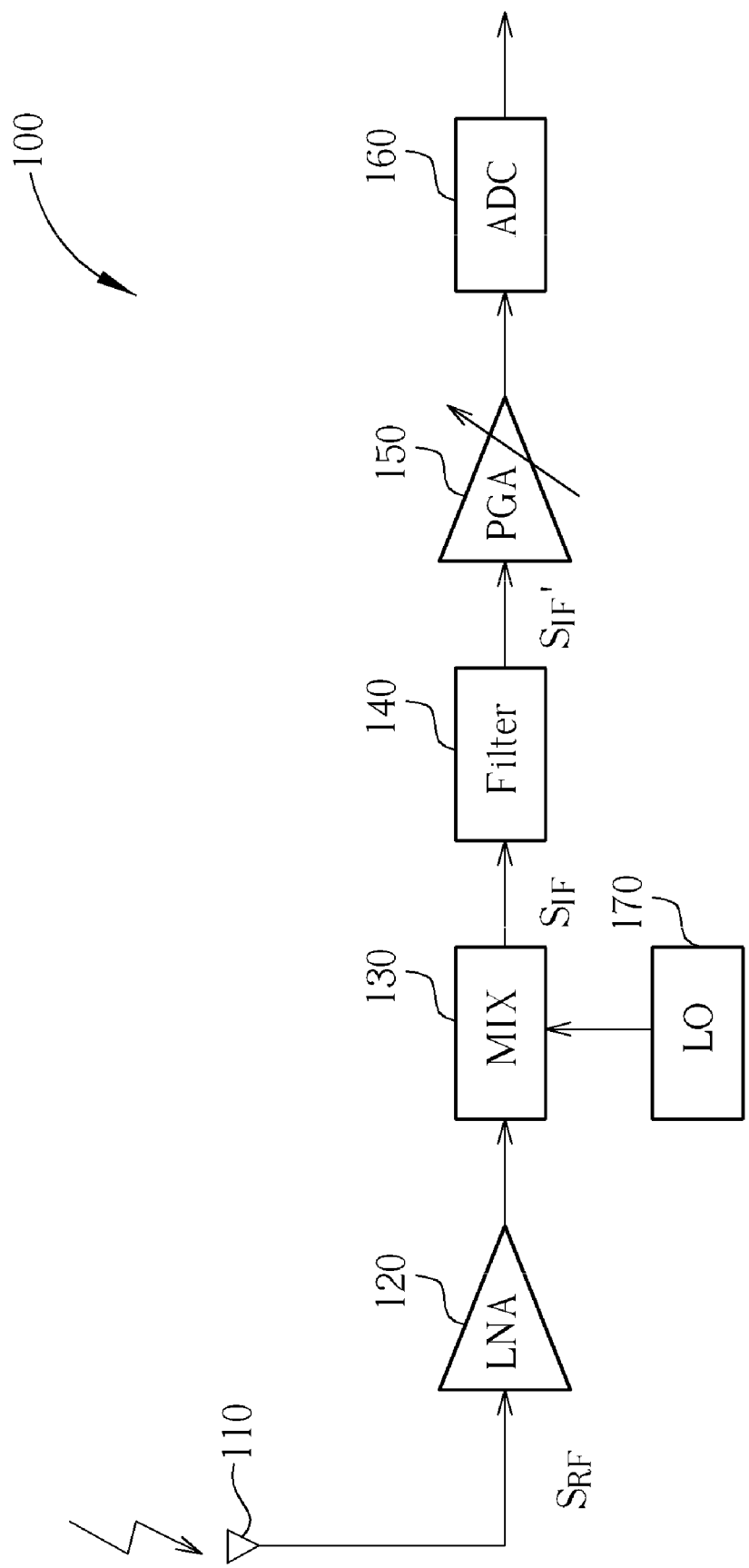
FIG. 1 is a block diagram of a conventional wireless receiver.
Figure 2A:
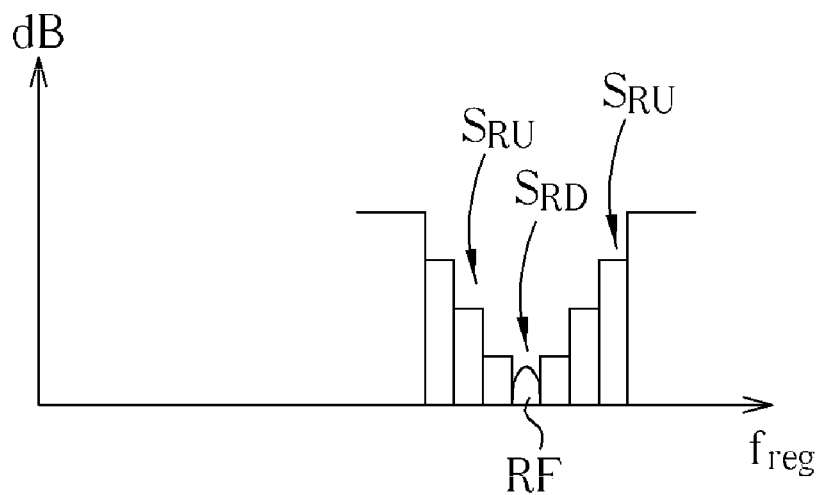
FIG. 2A is a spectrum diagram of an RF signal.
Figure 2B:
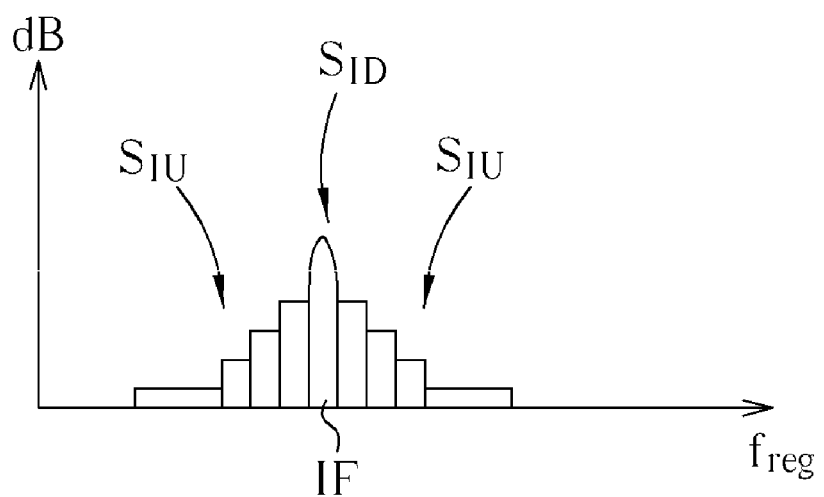
FIG. 2B is a spectrum diagram of a filtered IF signal.
Figure 3:
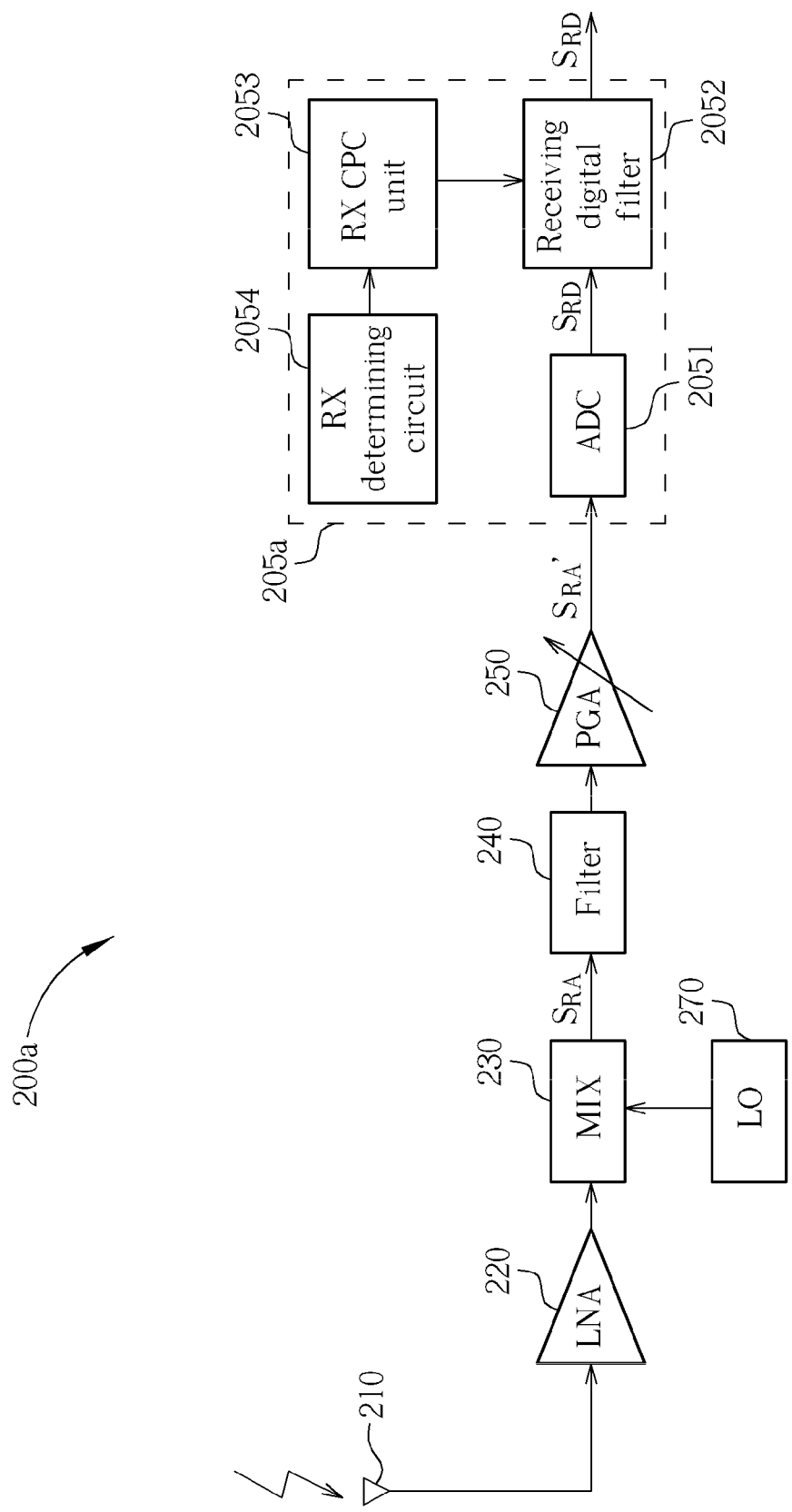
FIG. 3 is a block diagram of a processing apparatus applied for an analog filter of a wireless receiver system according to a first embodiment of the present invention.

FIG. 3 is a block diagram of a processing apparatus 205a applied for an analog filter of a wireless receiver system 200a according to a first embodiment of the present invention. The wireless receiver system 200a comprises the processing apparatus 205a, an antenna 210, an LNA 220, a receiving mixer 230, an analog filter (e.g. a band-pass filter or a low-pass filter) 240, a programmable gain amplifier (PGA) 250, and a local oscillator (LO) 270. The processing apparatus 205a comprises an ADC 2051, a receiving digital filter 2052, an RX CPC unit 2053, and an RX determining circuit 2054. The processing apparatus 205a is utilized for calibrating an analog filter (i.e. the filter 240) disposed at the signal receiving path of the wireless receiver system 200a. As in this Figure, a communication signal $S_{RA}$, which is received by the antenna 210, amplified by the LNA 220, and down-converted to an intermediate frequency (IF) band by the LO 270 and the receiving mixer 230, comprises a desired signal component and an undesired signal component. The desired signal component is located at a first frequency band centered at an IF frequency while the undesired signal component is located at a second frequency band almost non-overlapping the first frequency band. It should be noted that the second frequency band could be a frequency band higher or lower than the first frequency band.

The analog filter 240 is utilized to extract the desired signal component of the communication signal $S_{RA}$ and to reject (suppress) the undesired signal component of the communication signal $S_{RA}$. The ADC 2051 converts the analog communication signal $S_{RA}'$ that has been filtered by the analog filter 240 and amplified by the PGA 250 into a digital communication signal $S_{RD}$, and sends the digital communication signal $S_{RD}$ to the receiving digital filter 2052. That is, the ADC 2051 functions as a signal processing circuit for converting an analog signal transmitted from the analog filter 240 into a digital signal which is to be transmitted to the receiving digital filter 2052. The RX determining circuit 2054 determines a frequency-related characteristic of the analog filter 240. For example, the frequency-related characteristic could comprise at least one of an RC-time constant, a frequency response, an impulse response, a 3 dB frequency, a center frequency, a resistance, and a capacitance of the analog filter 240. The determined frequency-related characteristic is sent to the RX CPC unit 2053. The RX CPC unit 2053 has a transfer function (or a look up table) embedded therein, and calculates at least a compensation parameter for the receiving digital filter 2052 according to the frequency-related characteristic and the transfer function. That is, the at least one compensation parameter is generated with reference to the frequency-related characteristic of the analog filter 240. In particular, the frequency-related characteristic of the analog filter 240 with an actual center frequency IF' is sent to the RX CPC unit 2053; then the RX CPC unit 2053 calculates a corresponding compensation parameter for the receiving digital filter 2052. The frequency response of the receiving digital filter 2052 is capable of being configured or adjusted according to the corresponding compensation parameter.

Figure 4:
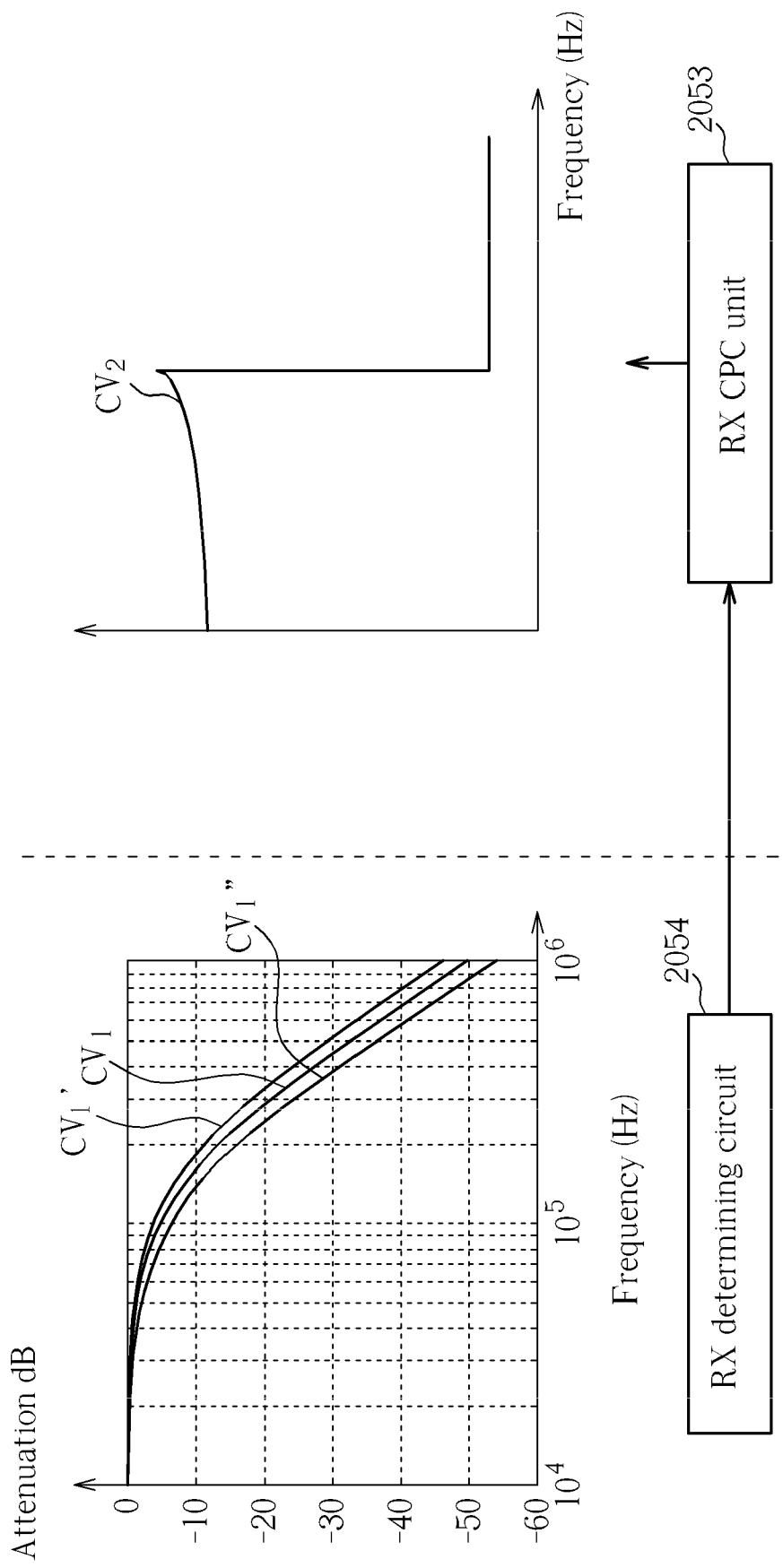
FIG. 4 is a diagram illustrating an example of a frequency response of a low-pass filter included within the analog filter shown in FIG. 3 and a designed frequency response of the receiving digital filter shown in FIG. 3.

Taking a low-pass filter (LPF) included with the analog filter 240 as an example, a frequency response of the LPF and the frequency response of the receiving digital filter 2052 are shown in FIG. 4. In order to reduce the total die area, the LPF of the first embodiment is implemented using a low-order and low-Q analog filter. For example, the low-pass filter can be a three-order low-Q LPF. The designed frequency response of the receiving digital filter 2052 is utilized for calibrating/compensating the frequency response of the low-order and low-Q analog LPF according to the at least one compensation parameter so that the desired signal component of the communication signal $S_{RA}$ will not be degraded or damaged even the LPF is a low-order and low-Q analog filter. In detail, as in FIG. 4, the curve $CV_1$ is meant to be the actual frequency response of the LPF, and the curve $CV_2$ is meant to be the designed frequency response of the receiving digital filter 2052. Due to the process variation, the resistance of the resistor(s) or the capacitance of the capacitor(s) within the LPF may be changed so that the frequency response $CV_1$ of the LPF may shift slightly to $CV_1'$ or $CV_1''$, as shown in the left of FIG. 4. In order to prevent the shifted frequency response of the LPF from degrading the desired signal component of the communication signal $S_{RA}$, the designed frequency response $CV_2$ of the receiving digital filter 2052 can be adjusted respectively for compensating the shifted frequency response of the LPF appropriately. In practice, an objective of the RX determining circuit 2054 is to estimate resistance of the resistor(s) and capacitance of the capacitor(s) in analog domain, so as to determine the frequency-related characteristic. Then, the RX CPC unit 2053 can calculate/generate corresponding compensation parameter(s) according to the determined frequency-related characteristic. Thus, the designed frequency response $CV_2$ of the receiving digital filter 2052 can be appropriately adjusted according to the different compensation parameter(s).

Figure 5:
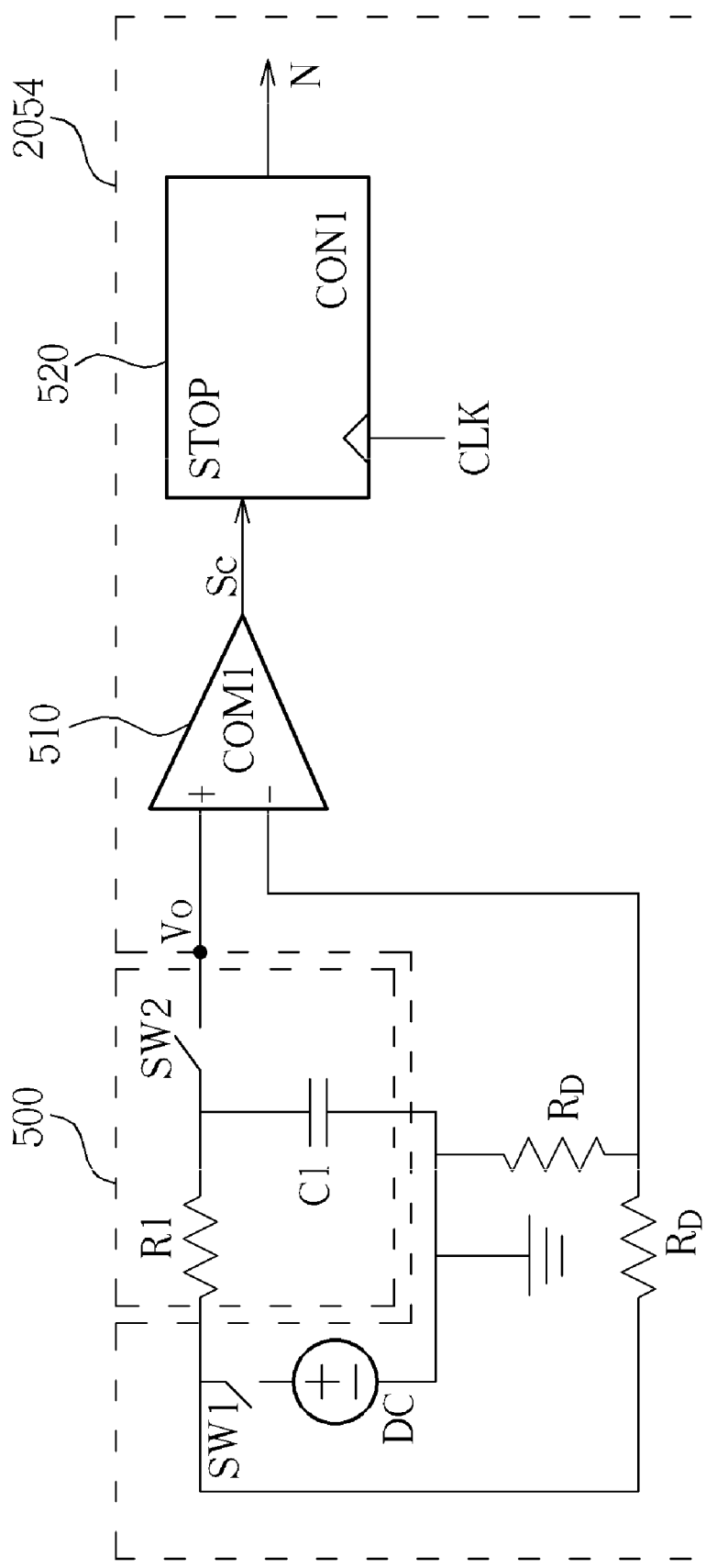
FIG. 5 is an embodiment of an RX determining circuit shown in FIG. 3.

For the RX determining circuit 2054, determining the frequency-related characteristic of the analog filter 240 comprises using a counter to directly/indirectly estimate the charge time of the capacitor(s) and resistance(s) within the LPF to estimate the product of the resistance and the capacitance. Please refer to FIG. 5. FIG. 5 is a diagram illustrating an example of the RX determining circuit 2054 as shown in FIG. 3. As described above, the RC-time constant of the LPF within the analog filter 240 is a frequency-related characteristic of the analog filter 240, and is a parameter for calibrating the LPF. Assume that the LPF within the analog filter 240 comprises a first resistor R1 and a first capacitive element, e.g. a first capacitor C1. The first resistor R1 and the first capacitor C1 constitute a stage of one pole, a low-Q LPF 500 of the analog filter 240, as shown in FIG. 5. The resistance of the first resistor R1 and the capacitance of the first capacitor C1 could determine an RC-time constant of the LPF 500. As in FIG. 5, the RX determining circuit 2054 directly tests the first resistor R1 and first capacitor C1, and comprises a DC voltage source, a voltage divider, a comparator (COM1) 510, and a counter (CON1) 520. The DC voltage source (e.g. 1V) provides an input DC voltage for the LPF 500. The voltage divider comprises two resistors $R_D$ and divides the input DC voltage into a reference voltage (e.g. 0.5V). The COM1 510 compares an output voltage $V_O$ of the LPF 500 with the reference voltage 0.5V and generates a comparison result $S_C$ for stopping the CON1 520. The CON1 520 counts a count value N by using a reference clock (CLK) before it is stopped.

When the CON1 520 is stopped, the count value N at the output of the CON1 520 represents the required charge time for the first capacitor C1 and first resistor R1 to raise the output voltage $V_O$ from, for example, zero volts (0V) to the reference voltage (0.5V). In other words, the RX determining circuit 2054 is arranged to count the charge time for the analog filter 240 to raise an output voltage of the analog filter 240 from a first voltage level to a second voltage level after the DC voltage is inputted into the analog filter 240. In addition, the count value N is indicative of the frequency-related characteristic of the LPF 500 within the analog filter 240 since the count value N is associated with the RC-time constant of LPF 500. The count value N is then provided to the RX CPC unit 2053. When the RC-time constant of LPF 500 is changed due to resistance variation of the first resistor R1 or capacitance variation of the first capacitor C1, the count value N is also changed.

For the RX CPC unit 2053, a look up table or a transfer function is arranged to record a relation between different count values and their corresponding compensation parameters beforehand. In another embodiment of the RX CPC unit 2053, a transfer function embedded is arranged to perform a translation between different count values and their corresponding compensation parameters immediately. Thus, once the count value N (i.e. the counted charge time) is determined, the RX CPC unit 2053 can generate at least a corresponding compensation parameter or multiple compensation parameters to the receiving digital filter 2052 according to the count value N, so as to configure/adjust the designed frequency response $CV_2$ of the receiving digital filter 2052 according to the corresponding compensation parameter(s). It should be noted that the transfer function can be built according to experiment results or mathematical analysis in advance, and can also be updated by users at any time in the operating. After the frequency response of the receiving digital filter 2052 is configured, the receiving digital filter 2052 is used to filter the digital communication signal $S_{RD}$ to generate a filtered digital communication signal $S_{RD}'$ as illustrated in FIG. 3.

In another embodiment, for saving power consumption spent on determining the frequency-related characteristics, the RX determining circuit 2054 comprises a set of capacitive and resistive elements for evaluating the first resistor R1 and the first capacitor C1 of LPF 500. The first resistor R1 and the resistive element of the RX determining circuit 2054, and the first capacitor C1 and the capacitive element of the RX determining circuit 2054, respectively, correspond to the same fabrication process substantially. Since the capacitance (or resistance) deviation ratio due to the fabrication process variation is almost the same for each capacitor (or resistor) within a small area of the same chip, estimating the charge time of the LPF 500 can be replaced by estimating a charge time of the set of capacitive and resistive elements. In this embodiment, the set of capacitive and resistive elements might be designed to have an RC-time constant substantially identical to the RC-time constant of the LPF 500; however, this is not meant to be a limitation of the present invention. In addition, the capacitive element (or called the second capacitor C2) is designed to include smaller capacitance than the first capacitor C1, and the resistive element (or called the second resistor R2) is designed to include greater resistance than the first resistor R1. Since the second capacitor C2 has smaller capacitance, charging the second capacitor C2 to raise the voltage V' from zero volts to a reference voltage level consumes less energy than charging/discharging the first capacitor C1 to raise the voltage $V_O$ from zero volts to the same reference voltage level.

For example, the ideal resistance of the first resistor R1 and the ideal capacitance of first capacitor C1 are designed to be 10K and 100 p, respectively, but the actual resistance and capacitance thereof are 9.9K and 99 p due to 1% fabrication process variation. The ideal resistance of the second resistor R2 and the ideal capacitance of the second capacitor C2 are designed to be 100K and 10 p, respectively, but the actual resistance and capacitance thereof are 99K and 9.9 p due to the same 1% fabrication process variation. Please note that a product of the real capacitance of the first capacitor C1 and the real resistance of the first resistor R1 is substantially the same as a product of the real capacitance of the second capacitor C2 and the real resistance of the second resistor R2, as mentioned above. Hence, the count value N generated by counting the charge time for the first capacitor C1 and first resistor R1 is substantially the same as a count value N' generated by counting the charge time for the second capacitor C2 and second resistor R2. However, charging the second capacitor C2 requires less energy than the first capacitor C1 provided that the capacitors are charged to the same capacitor voltage. The detailed implementation is illustrated below.

Figure 6:
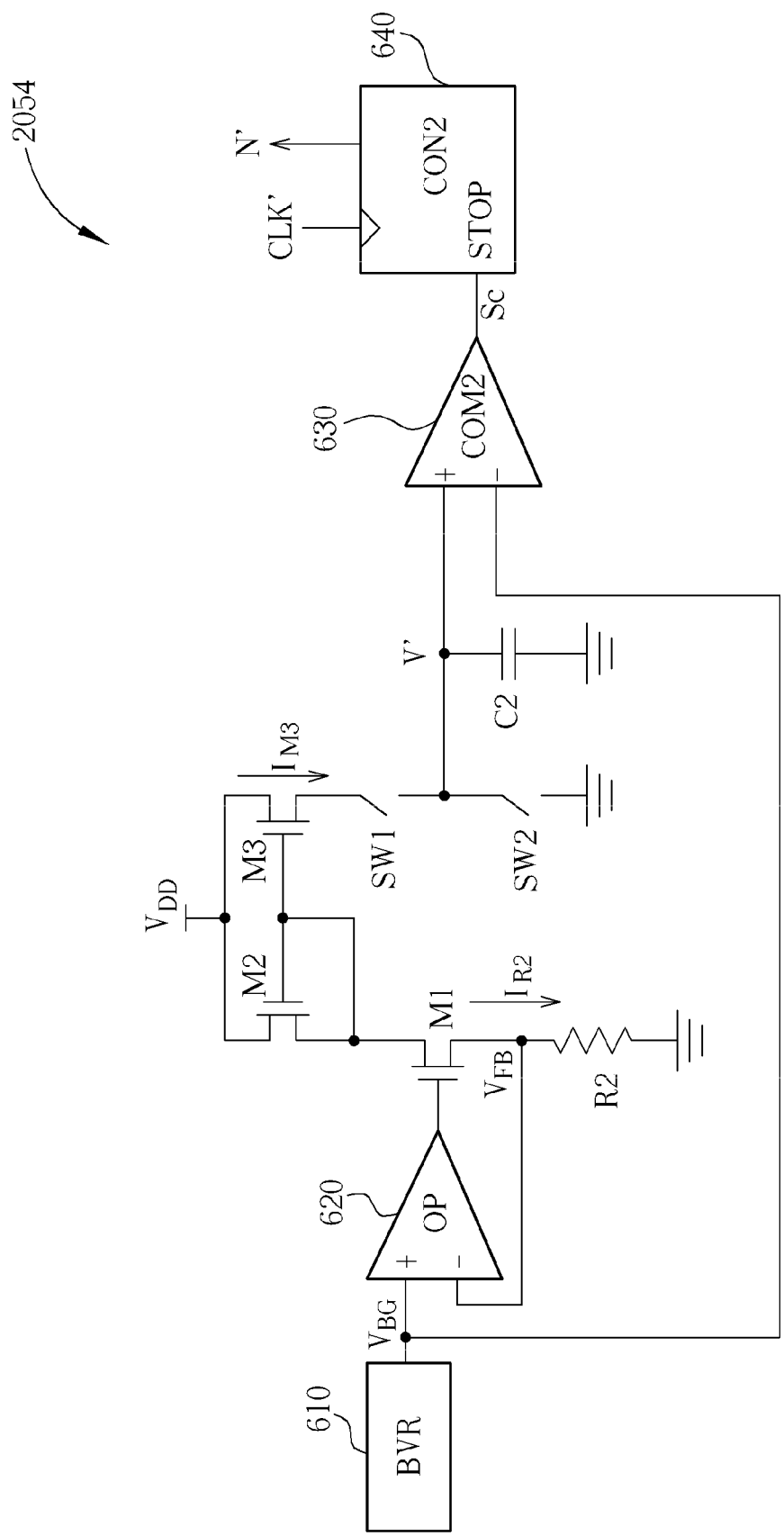
FIG. 6 is another embodiment of the RX determining circuit shown in FIG. 3.

FIG. 6 shows another embodiment of the RX determining circuit 2054 in FIG. 3. The RX determining circuit 2054 comprises a bandgap voltage reference (BVR) 610, an operational amplifier (OP) 620, the second resistor R2, the second capacitor C2, transistors M1-M3, switches SW1-SW2, a comparator (COM2) 630, and a counter (CON2) 640. In this embodiment, the RX determining circuit 2054 tests the second capacitor C2 and the second resistor R2 to estimate the frequency-related characteristic (i.e. the count value N') of the LPF 500, by counting the charge time for the second capacitor C2 and second resistor R2. The BVR 610 generates a reference voltage $V_{BG}$ and provides the reference voltage $V_{BG}$ to a positive input of the OP 620. A negative input of the OP 620 is connected to an output of the OP 620 via the transistor M1 and a feedback path. In other words, the combination of the BVR 610, OP 620, transistor M1, and second resistor R2 acts as a regulator for making the feedback voltage $V_{FB}$ equal to the reference voltage $V_{BG}$. Hence, a current $I_{R2}$ flowing through the second resistor R2 and the transistors M1 and M2 is equal to ($V_{BG}$/R2). When the switch SW1 used for controlling the charging is turned on and the switch SW2 used for controlling the discharging is turned off, a current $I_{M3}$ generated by the current mirror configuration of transistors M2 and M3 charges the second capacitor C2 initially having a zero point (e.g., 0V), and the CON2 640 starts to count according to a reference clock CLK' of a fixed clock frequency $F_{CLK}'$. In addition, for reducing a testing time for charging the second capacitor C2, an aspect ratio of the transistor M3 can be further designed to be M times as great as an aspect ratio of the transistor M2, and therefore the current $I_{M3}$ is M times the current $I_{R2}$. When the voltage of the second capacitor C2 is charged to the reference voltage $V_{BG}$, the COM2 630 sends a comparison result $S_C$ to the CON2 640 to stop the counting operation. In this example, the count value N' equal to $$\frac{R2 \times C2 \times F_{CLK}'}{M}$$

is then obtained, and sent to the RX CPC unit 2053. It should be noted that compensation parameter(s) recorded by the look up table (or translated by the transfer function) embedded within the RX CPC unit 2053 should be adjusted correspondingly when the current $I_{M3}$ is arranged to be M times the current $I_{R2}$.

Figure 7A:
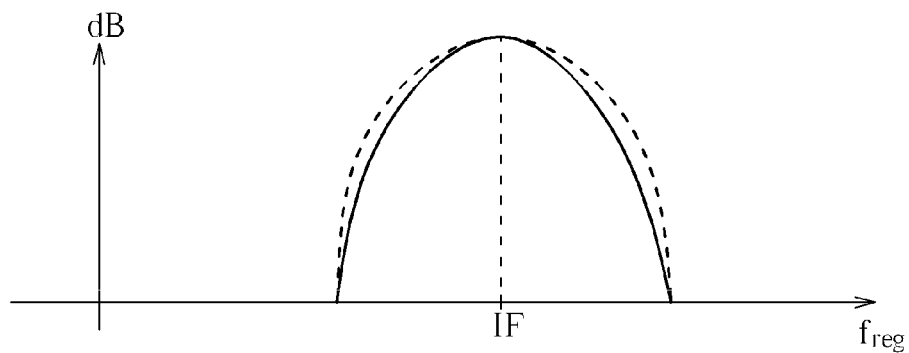
FIG. 7A is a diagram illustrating an actual frequency response and a predetermined frequency response of the analog filter shown in FIG. 3.
Figure 7B:
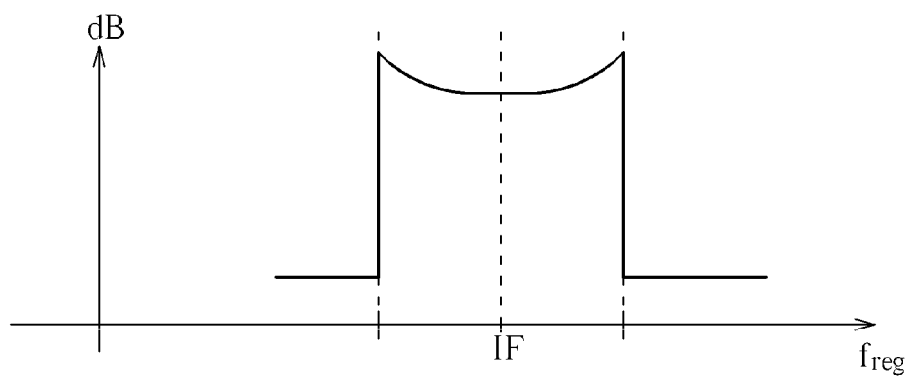
FIG. 7B is a diagram illustrating a designed frequency response of the receiving digital filter shown in FIG. 3.
Figure 7C:
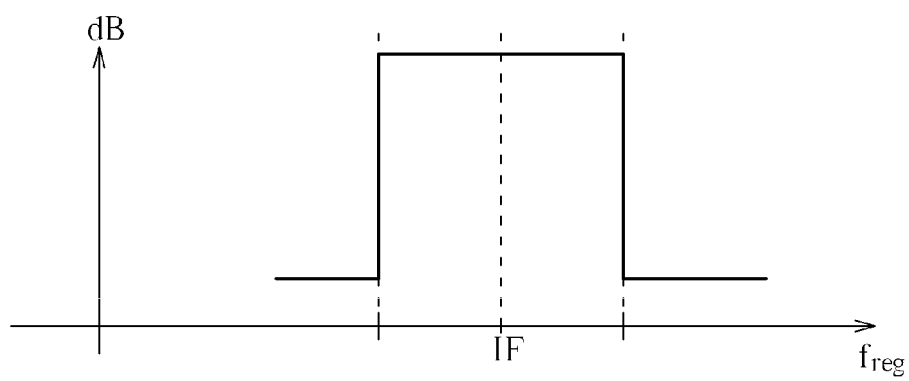
FIG. 7C is a diagram illustrating an overall frequency response of the receiving digital filter and the analog filter shown in FIG. 3.

Please refer to FIG. 7A-7C. FIG. 7A-7C are diagrams respectively illustrating the frequency response of the analog filter 240, the frequency response of the receiving digital filter 2052, and an overall frequency response of the analog filter 240 and receiving digital filter 2052 (or more precisely, a schematic overall frequency response of the analog filter 240, ADC 2051, and receiving digital filter 2052). As shown in FIG. 7A, the solid curve represents an actual frequency response of the analog filter 240, and the dash-dotted curve represents a predetermined frequency response of the analog filter 240. Due to unpreventable fabrication process variation or other non-ideal effects as mentioned above, the shape of the actual frequency response of the analog filter 240 is changed and therefore different from the predetermined frequency response thereof. When the analog filter 240 filters the incoming communication signal $S_{RA}$ as illustrated in FIG. 3, the desired signal component of the communication signal $S_{RA}$ is adversely degraded, and the undesired signal component of the communication signal $S_{RA}$ is not rejected well. It is therefore that the processing apparatus 205a is used to calibrate/compensate the actual frequency response of the analog filter 240. As in FIG. 7C, by way of the calibration of the frequency response of the receiving digital filter 2052 in FIG. 7B, the desired signal component of the communication signal $S_{RA}$ can almost pass through the overall frequency response, and the undesired signal component of the communication signal $S_{RA}$ can be well rejected by the overall frequency response. Note that the overall frequency response at the first frequency band ($1^{st}$ freq. band) where the desired signal component is located is substantially a constant value, and therefore the desired signal component will almost not be degraded or damaged. The overall frequency response at the second frequency band ($2^{nd}$ freq. band) where the undesired signal component is located is much smaller than the constant value, and therefore the undesired signal component can be rejected well.

In practice, since the communication signal $S_{RA}$ is filtered by the analog filter 240 and the receiving digital filter 2052, the analog filter 240 can be designed to roughly filter the communication signal $S_{RA}$ in order to reduce the chip area, and the receiving digital filter 2052 can be designed to accurately compensate the desired signal component of the communication signal that damaged or degraded by the analog filter. Hence, low-order and low-Q analog filters are allowed to be employed in the wireless receiver system 200a. For example, the analog filter 240 shown in FIG. 3 can be implemented with 3 stages of one pole and low-Q filters. A low-Q filter can be defined as a filter selecting or rejecting a range of frequencies that is broad in comparison to the filter's center frequency. The Q value may be defined as the ratio of the centre frequency divided by 3 dB bandwidth. As known to people skilled in the art, the bandwidth of the low-order and low-Q analog filter can be easily programmed, and the low-order and low-Q analog filter is therefore more suitable for a multi-mode receiver. Furthermore, low-order and low-Q analog filters require smaller chip areas than high-order and high-Q analog filters, therefore reducing analog filter areas. Furthermore, the processing apparatus 205a can be also applied to calibrate/compensate any category of analog filters, including a low-pass analog filter, a band-pass analog filter, a band-reject analog filter, and a high-pass analog filter.

Figure 8:
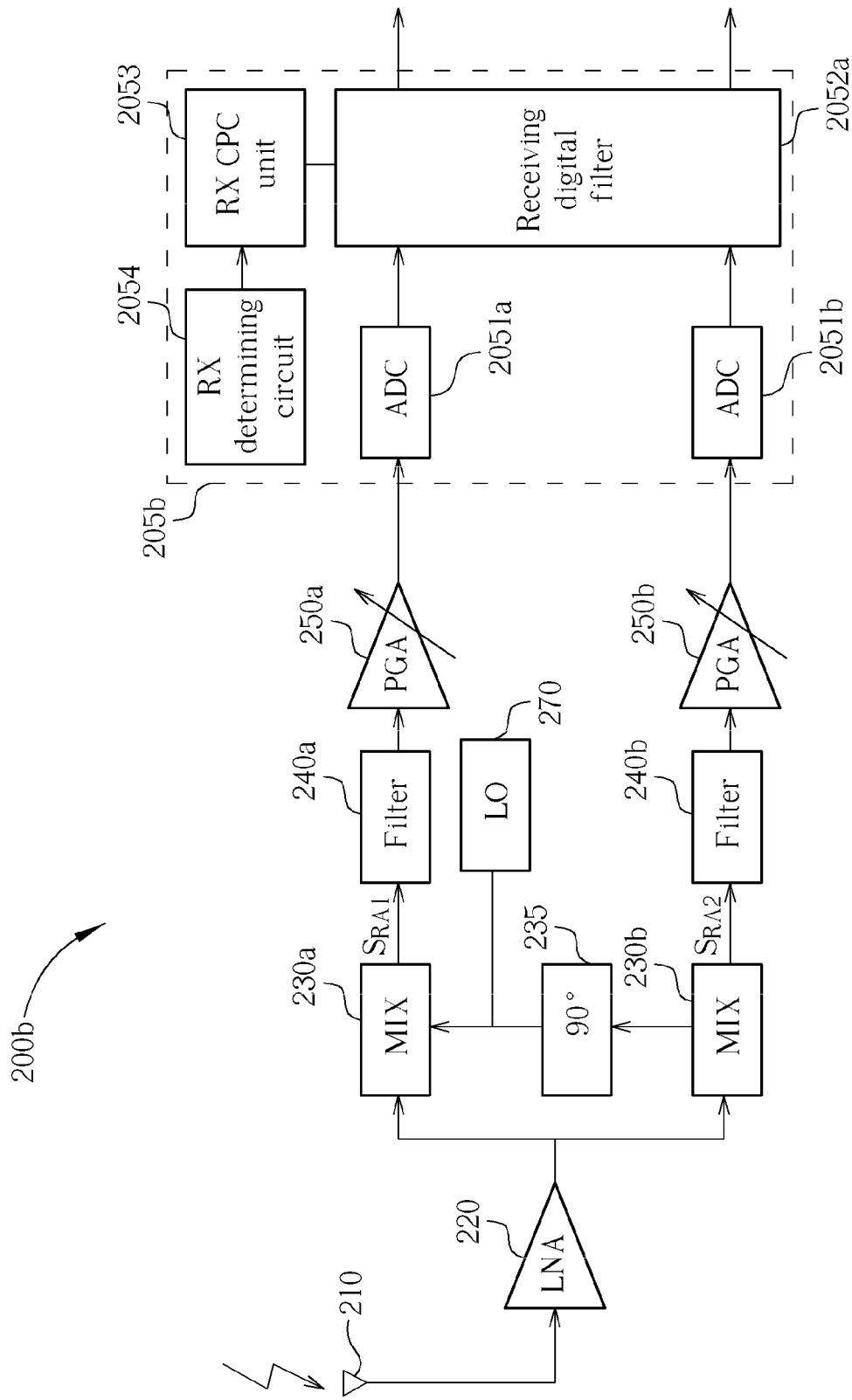
FIG. 8 is a block diagram of a processing apparatus applied for two analog filters on the in-phase and quadrature paths of a wireless receiver system according to a second embodiment of the present invention.

In addition, calibrating an analog filter using a digital filter can be used to calibrate two analog filters respectively disposed on the in-phase and quadrature paths. Please refer to FIG. 8. FIG. 8 is a block diagram of a processing apparatus 205b applied for two analog filters on the in-phase and quadrature paths of a wireless receiver system 200b according to a second embodiment of the present invention. The wireless receiver system 200b comprises the processing apparatus 205b, an antenna 210, an LNA 220, two receiving mixers 230a and 230b, a 90 degrees phase shifter 235, a local oscillator (LO) 270, two analog filters 240a and 240b, and two programmable gain amplifiers (PGA) 250a and 250b. The processing apparatus 205b comprises two ADCs 2051a and 2051b, a receiving digital filter 2052a, an RX CPC unit 2053, and an RX determining circuit 2054. The receiving digital filter 2052a is slightly different from the receiving digital filter 2052 since the filter 2052a is used for respectively compensating the analog filter 240a positioned on the in-phase path and the analog filter 240b positioned on the quadrature path. The operations and functions of the RX determining circuit 2054 and RX CPC unit 2053 shown in FIG. 8 are similar to those of the RX determining circuit 2054 and RX CPC unit 2053 shown in FIG. 3, and it is well known that a single digital filter can be used on both the in-phase and quadrature paths. Further description is not detailed for brevity. In addition, the RX determining circuit 2054, the RX CPC unit 2053 and the receiving digital filter 2052a could be shared by the in-phase and quadrature paths as illustrated in this embodiment of FIG. 8, or alternatively, could be independently implemented by separate devices according to another embodiment (not illustrated).

Figure 9:
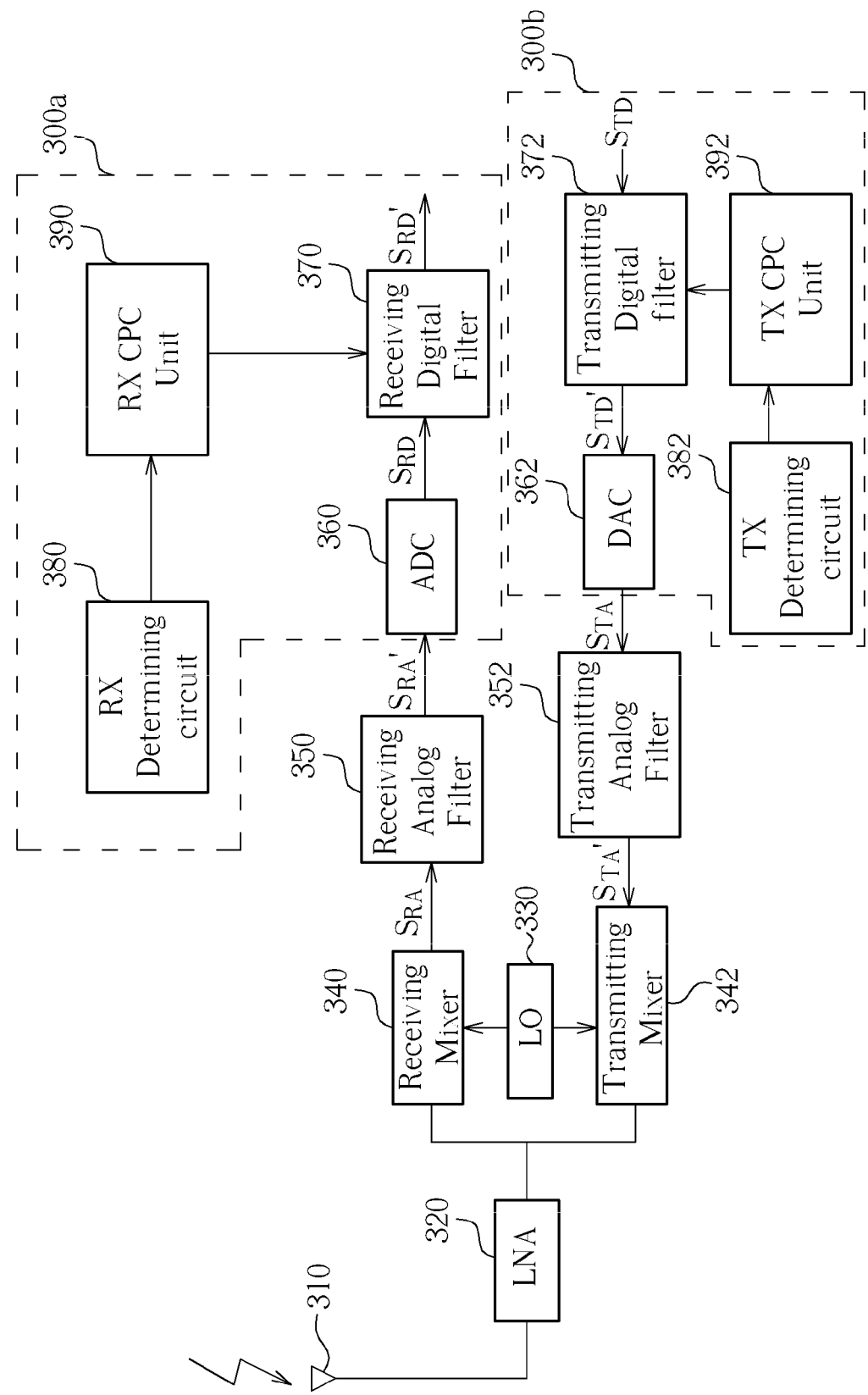
FIG. 9 is a diagram illustrating a processing apparatus applied to a transmitting part of a transceiver and an apparatus applied to a receiving part of the transceiver according to a third embodiment of the present invention.

Furthermore, calibrating an analog filter using a digital filter can be also applied to a transceiver to respectively calibrate a receiving analog filter and a transmitting analog filter. Please refer to FIG. 9. FIG. 9 is a diagram of a processing apparatus 300a and a processing apparatus 300b applied to a transceiver according to a third embodiment of the present invention. Note that only components pertinent to technical features of the present invention are shown in FIG. 9. Therefore, only an antenna 310, a low noise amplifier (LNA) 320, a local oscillator (LO) 330, a receiving mixer 340, a transmitting mixer 342, a receiving analog filter 350, a transmitting analog filter 352, an analog-to-digital converter (ADC) 360, a digital-to-analog converter (DAC) 362, a receiving digital filter 370, a transmitting digital filter 372, an RX determining circuit 380, a TX determining circuit 382, an RX compensation parameter calculating (CPC) unit 390, and a TX CPC unit 392 are shown, while other well-known components of the transceiver are omitted for brevity.

As shown in FIG. 9, the calibrating method provided according to the third embodiment of the present invention can be utilized to calibrate the analog filter 350 disposed at a signal receiving path of the transceiver, or to calibrate the analog filter 352 disposed at a signal transmitting path of the transceiver. The function and operation of the processing apparatus 300a is identical to that of the processing apparatus 205a, and further description is omitted. Calibrating the transmitting analog filter 352 with the processing apparatus 300a is similar to calibrating the receiving analog filter 350 with the processing apparatus 300b. A difference is that the transmitting digital filter 372 firstly filters a digital communication signal $S_{TD}$ to generate a filtered digital communication signal $S_{TD}'$, which is then converted into an analog communication signal $S_{TA}$ by the DAC 362. The transmitting analog filter 352 then filters the analog communication signal $S_{TA}$ and generates a filtered analog communication signal $S_{TA}'$. The filtered analog communication signal $S_{TA}'$ is up-converted by the LO 330 and the transmitting mixer 342 to a RF band, amplified by the LNA 320, and transmitted by the antenna 310.

The TX determining circuit 382 determines a frequency-related characteristic of the transmitting analog filter 352 and sends the frequency-related characteristic to the TX CPC unit 392. The TX CPC unit 392 calculates at least a compensation parameter for the transmitting digital filter 372 and configures a frequency response of the transmitting digital filter 372 according to the compensation parameter. An overall frequency response of the transmitting analog filter 352 and the transmitting digital filter 372 (or more precisely, an overall frequency response of the transmitting analog filter 352, the DAC 362, and the transmitting digital filter 370) at the frequency band where the desired signal component located is substantially a constant value, therefore the desired signal component will almost not be degraded or damaged. The overall frequency response at the second frequency band where the undesired signal component is located is much smaller than the constant value, and therefore the undesired signal component can be rejected well.

The communication signal at the signal receiving path is filtered by the receiving analog filter 350 and then filtered by the receiving digital filter 370. The communication signal at the signal transmitting path is filtered by the transmitting digital filter 372 and then filtered by the transmitting analog filter 352. In other words, a digital filter for calibrating an analog filter can filter a signal after the signal is already filtered by the analog filter to thereby compensate the imperfect frequency response possessed by the analog filter, or can filter the signal before the signal is filtered by the analog to thereby pre-compensate the imperfect frequency response possessed by the analog filter. As extra capacitors for calibrating the analog filter are no longer required, the die area can be greatly reduced.

In addition, calibrating/compensating an analog filter (a receiving analog filter or a transmitting analog filter) by using a digital filter in digital domain can merely operates at the manufacture. That is, in another embodiment, a communication device such as the wireless receiver system 200a may exclude the RX determining circuit 2054 and RX CPC unit 2053 in order to reduce the size of the wireless receiver system 200a. In other words, the RX determining circuit 2054 and RX CPC unit 2053 are optionally installed within the on-sale product of the wireless receiver system 200a. The above-mentioned compensation parameter(s) can be generated by an external device at manufacture. In other embodiments, the wireless receiver system 200b can be designed to exclude the RX determining circuit 2054 and RX CPC unit 2053 to reduce the size of the wireless receiver system 200b, and the transceiver shown in FIG. 9 can be designed to exclude the RX determining circuit 380, RX CPC unit 390, TX determining circuit 382, and the TX CPC unit 392 to reduce the size of the transceiver itself.

According to the above embodiments of the present invention, the above-mentioned processing apparatus and methods calibrate analog filters in digital domain, therefore extra capacitors and traditional analog calibrating approaches are no longer required. Hence, the above processing apparatus and method can reduce the die area efficiently, which simplifies the complexity of wireless receiver designs and is very suitable for SOC (system on chip) design.

Figure 10:
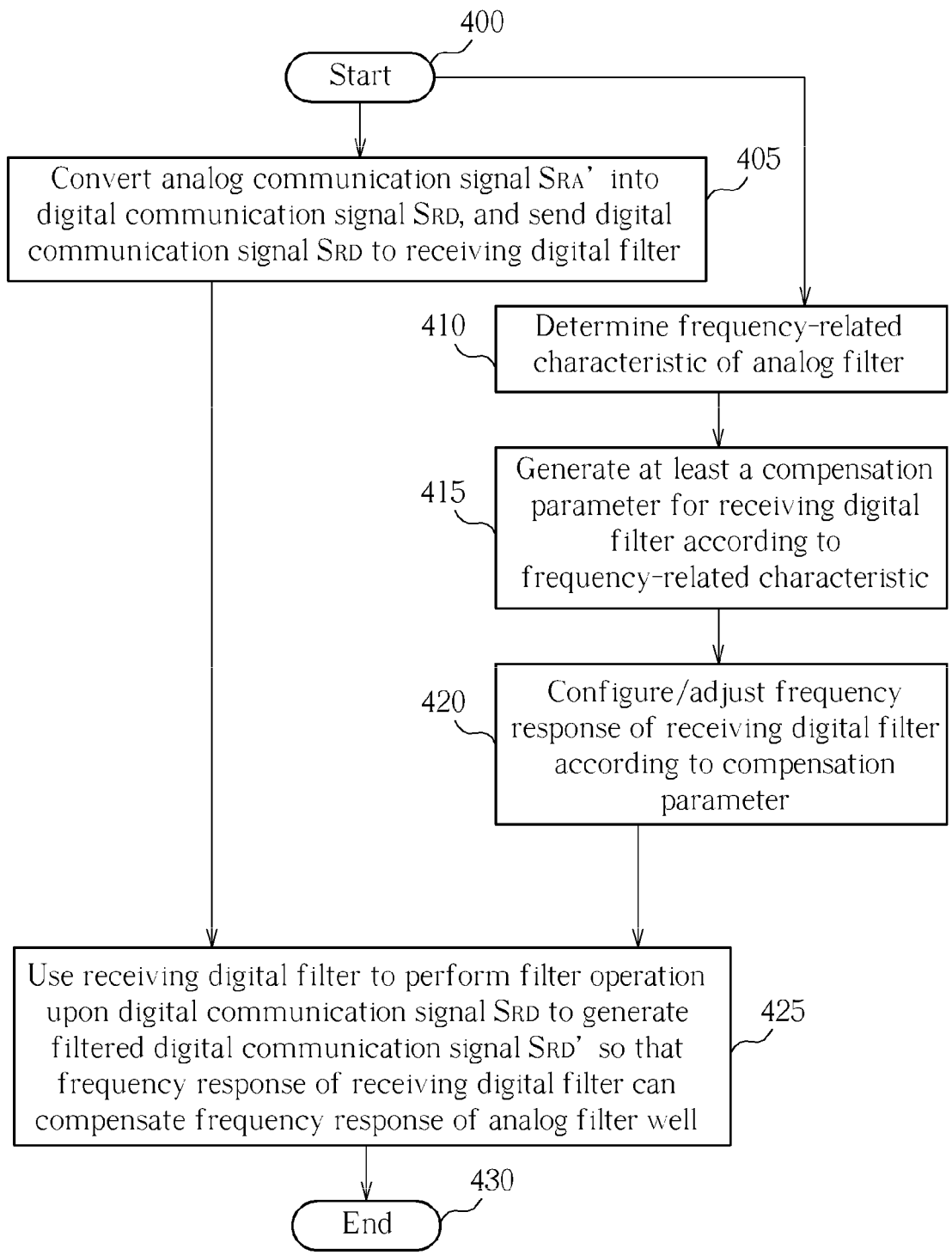
FIG. 10 is a diagram illustrating a flowchart of the operation of the processing apparatus of the first embodiment shown in FIG. 3.

In order to illustrate the spirits of the present invention clearly, FIG. 10 shows a flowchart of the operation of the processing apparatus 205a for calibrating the analog filter 240 in the first embodiment. Provided that substantially the same result is achieved, the steps of the flowchart shown in FIG. 10 need not be in the exact order shown and need not be contiguous, that is, other steps can be intermediate; the steps of the flowchart shown in FIG. 10 are detailed as below:

Step 400: Start;

Step 405: Convert the analog communication signal $S_{RA}'$ into the digital communication signal $S_{RD}$, and send the digital communication signal $S_{RD}$ to the receiving digital filter 2052;

Step 410: Determine the frequency-related characteristic of the analog filter 240;

Step 415: Generate at least a compensation parameter for the receiving digital filter 2052 according to the frequency-related characteristic;

Step 420: Configure/adjust the frequency response of the receiving digital filter 2052 according to the compensation parameter Step 425: Use the receiving digital filter to perform a filter operation upon the digital communication signal $S_{RD}$ to generate the filtered digital communication signal $S_{RD}'$ so that the frequency response of the receiving digital filter 2052 can compensate the frequency response of the analog filter 240 well; and Step 430: End.

Those skilled in the art will readily observe that numerous modifications and alterations of the device and method may be made while retaining the teachings of the invention.

What is claimed is:

1. A processing apparatus for calibrating an analog filter of a communication device in a digital domain, the analog filter being arranged to perform a filtering operation upon a communication signal in an analog domain, and the processing apparatus comprises:
    a signal processing circuit, for transforming the communication signal between the digital domain and the analog domain; and
    a digital filter, coupled to the signal processing circuit, for outputting a filtered communication signal by performing a filtering operation upon the communication signal in the digital domain;
    wherein a frequency response of the digital filter is arranged to compensate a frequency response of the analog filter according to at least a compensation parameter generated with reference to a frequency-related characteristic of the analog filter.

2. The processing apparatus of claim 1, wherein the compensation parameter is generated by an external unit at manufacture.

3. The processing apparatus of claim 1, wherein the communication signal comprises a desired signal component located at a first frequency band and an undesired signal component located at a second frequency band not overlapping the first frequency band, and an overall frequency response of the analog filter and the digital filter at the first frequency band is substantially a constant value.

4. The processing apparatus of claim 3, wherein an overall frequency response at the second frequency band is smaller than the constant value.

5. The processing apparatus of claim 1, wherein the analog filter is a low-Q filter.

6. The processing apparatus of claim 1, wherein the frequency-related characteristic comprise at least one of an RC-time constant, a frequency response, an impulse response, a 3 dB frequency, a center frequency, and a resistance or a capacitance.

7. The processing apparatus of claim 1, further comprising:
    a determining circuit, for determining the frequency-related characteristic of the analog filter; and
    a compensation parameter generating unit, coupled to the determining circuit, for generating the compensation parameter according to the frequency-related characteristic.

8. The processing apparatus of claim 7, wherein the analog filter comprises a capacitive element and a resistive element, and the determining circuit is arrange to determine the frequency-related characteristic of the analog filter by directly testing the capacitive element and the resistive element.

9. The processing apparatus of claim 8, wherein the determining circuit is arranged to count a charge time for the analog filter to raise an output voltage of the analog filter from a first voltage level to a second voltage level after a DC voltage is inputted into the analog filter; and the compensation parameter generating unit is arranged to calculate the compensation parameter according to the charge time.

10. The processing apparatus of claim 7, wherein the analog filter comprises a first capacitive element and a first resistive element, and the determining circuit comprises:
    a second capacitive element and a second resistive element, wherein the first and second capacitive elements, and the first and second resistive elements, respectively, correspond to the same fabrication process substantially; and
    a test circuit, coupled to the second capacitive element and the second resistive element, for determining the frequency-related characteristic of the analog filter by testing the second capacitive element and the second resistive element.

11. The processing apparatus of claim 10, wherein the test circuit is arranged to count a charge time for the second capacitive element and the second resistive element to raise an output voltage of the second capacitive element from a first voltage level to a second voltage level after a DC voltage is inputted; and the compensation parameter generating unit is arranged to calculate the compensation parameter according to the charge time.

12. The processing apparatus of claim 10, wherein a capacitance of the first capacitive element is greater than a capacitance of the second capacitive element.

13. The processing apparatus of claim 1, wherein the analog filter is used for filtering the communication signal received from or arranged to be transmitted to an antenna of the communication device, and the digital filter is used for filtering the communication signal received from or arranged to be transmitted to the analog filter so as to compensate the frequency response of the analog filter.

14. A communication device, comprising:
    an analog filter, for performing a filtering operation upon a communication signal in an analog domain;
    a signal processing circuit, coupled to the analog filter, for transforming the communication signal between a digital domain and the analog domain; and
    a digital filter, coupled to the signal processing circuit, for performing a filtering operation upon the communication signal in the digital domain;
    wherein a frequency response of the digital filter is arranged to compensate a frequency response of the analog filter according to at least a compensation parameter generated with reference to a frequency-related characteristic of the analog filter.

15. A processing apparatus for generating a compensation parameter to determine a frequency response of a digital filter to calibrate a frequency response of an analog filter, the analog filter and digital filter being respectively used for performing filtering operations upon a communication signal in an analog domain and in a digital domain, and the processing apparatus comprises:
    a determining circuit, for determining a frequency-related characteristic of the analog filter; and
    a compensation parameter generating unit, coupled to the determining circuit, for generating the compensation parameter according to the frequency-related characteristic, and outputting the compensation parameter to the digital filter for configuring the frequency response of the digital filter.

16. The processing apparatus of claim 15, wherein the analog filter comprises a capacitive element and a resistive element, and the determining circuit is arrange to determine the frequency-related characteristic of the analog filter by directly testing the capacitive element and the resistive element.

17. The processing apparatus of claim 16, wherein the determining circuit is arranged to count a charge time for the analog filter to raise an output voltage of the analog filter from a first voltage level to a second voltage level after a DC voltage is inputted into the analog filter; and the compensation parameter generating unit is arranged to calculate the compensation parameter according to the charge time.

18. The processing apparatus of claim 15, wherein the analog filter comprises a first capacitive element and a first resistive element, and the determining circuit comprises:
a second capacitive element and a second resistive element, wherein the first and second capacitive elements, and the first and second resistive elements, respectively, correspond to the same fabrication process substantially; and
a test circuit, coupled to the second capacitive element and the second resistive element, for determining the frequency-related characteristic of the analog filter by testing the second capacitive element and the second resistive element.

19. The processing apparatus of claim 18, wherein the test circuit is arranged to count a charge time for the second capacitive element and the second resistive element to raise an output voltage of the second capacitive element from a first voltage level to a second voltage level after a DC voltage is inputted; and the compensation parameter generating unit is arranged to calculate the compensation parameter according to the charge time.

20. The processing apparatus of claim 18, wherein a capacitance of the first capacitive element is greater than a capacitance of the second capacitive element.

21. A method for calibrating an analog filter of a communication device in a digital domain, the analog filter being arranged to perform a filtering operation upon a communication signal in an analog domain, and the method comprises:
transforming the communication signal between the digital domain and the analog domain; and
using a digital filter to output a filtered communication signal by performing a filtering operation upon the communication signal in the digital domain, so as to use a frequency response of the digital filter to compensate a frequency response of the analog filter according to at least a compensation parameter generated with reference to a frequency-related characteristic of the analog filter.

22. The method of claim 21, further comprising:
generating the compensation parameter by using an external unit at manufacture.

23. The method of claim 21, wherein the frequency-related characteristic comprise at least one of an RC-time constant, a frequency response, an impulse response, a 3 dB frequency, a center frequency, and a resistance or a capacitance.

24. The method of claim 21, wherein the analog filter is used for filtering the communication signal received from or arranged to be transmitted to an antenna of the communication device, and the step of using the digital filter to perform the filtering operation upon the communication signal in the digital domain comprises:
filtering the communication signal received from or arranged to be transmitted to the analog filter so as to compensate the frequency response of the analog filter.

25. A method for generating a compensation parameter to determine a frequency response of a digital filter for calibrating a frequency response of an analog filter, the analog filter and the digital filter being respectively used for performing filtering operations upon a communication signal in an analog domain and in a digital domain, and the method comprises:
determining a frequency-related characteristic of the analog filter; and
generating the compensation parameter according to the frequency-related characteristic and outputting the compensation parameter to the digital filter for configuring the frequency response of the digital filter.

26. The method of claim 25, wherein the analog filter comprises a capacitive element and a resistive element, and the step of determining the frequency-related characteristic of the analog filter comprises:
determining the frequency-related characteristic of the analog filter by directly testing the capacitive element and the resistive element.

27. The method of claim 26, wherein the step of determining the frequency-related characteristic of the analog filter by directly testing the capacitive element and the resistive element comprises:
providing a DC voltage to the analog filter; and
counting a charge time for the analog filter to raise an output voltage of the analog filter from a first voltage level to a second voltage level; and
the step of generating the compensation parameter according to the frequency-related characteristic comprises:
calculating the compensation parameter according to the charge time.

28. The method of claim 25, wherein the analog filter comprises a first capacitive element and a first resistive element, and the step of determining the frequency-related characteristic of the analog filter comprises:
providing a second capacitive element and a second resistive element, wherein the first and second capacitive elements, and the first and second resistive elements, respectively, correspond to the same fabrication process substantially; and
determining the frequency-related characteristic of the analog filter by testing the second capacitive element and the second resistive element.

29. The method of claim 28, wherein the step of determining the frequency-related characteristic of the analog filter by testing the second capacitive element and the second resistive element comprises:
providing a DC voltage to the second resistive element to provide a current for charging the second capacitive element; and
counting a charge time for the second capacitive element and the second resistive element to raise an output voltage of the second capacitive element from a first voltage level to a second voltage level; and
the step of generating the compensation parameter according to the frequency-related characteristic comprises:
calculating the compensation parameter according to the charge time.

30. The method of claim 28, wherein a capacitance of the first capacitive element is greater than a capacitance of the second capacitive element.

* * * * *